(12) United States Patent
Lewandowski et al.

(10) Patent No.: US 9,953,908 B2
(45) Date of Patent: Apr. 24, 2018

(54) METHOD FOR FORMING SOLDER BUMPS USING SACRIFICIAL LAYER

(71) Applicant: International Business Machines Corporation, Armonk, NY (US)

(72) Inventors: Eric P. Lewandowski, White Plains, NY (US); Jae-Woong Nah, Closter, NJ (US); Peter J. Sorce, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 14/928,263

(22) Filed: Oct. 30, 2015

(65) Prior Publication Data

US 2017/0125329 A1    May 4, 2017

(51) Int. Cl.
| | |
|---|---|
| *H01L 23/498* | (2006.01) |
| *H01L 21/48* | (2006.01) |
| *H01L 21/027* | (2006.01) |
| *H01L 21/3205* | (2006.01) |
| *H01L 21/3213* | (2006.01) |

(Continued)

(52) U.S. Cl.
CPC .... *H01L 23/49816* (2013.01); *H01L 21/0273* (2013.01); *H01L 21/32051* (2013.01); *H01L 21/32133* (2013.01); *H01L 21/4853* (2013.01); *H01L 23/49838* (2013.01); *H01L 23/49866* (2013.01); *H01L 23/49894* (2013.01);

(Continued)

(58) Field of Classification Search
CPC ........... H01L 23/49816; H01L 21/0273; H01L 21/4853; H05K 3/064; Y10T 29/49156
See application file for complete search history.

(56) References Cited

U.S. PATENT DOCUMENTS

| | | | |
|---|---|---|---|
| 5,597,469 A * | 1/1997 | Carey | C25D 5/022 |
| | | | 205/118 |
| 5,759,737 A * | 6/1998 | Feilchenfeld | G03F 7/00 |
| | | | 257/E21.503 |

(Continued)

FOREIGN PATENT DOCUMENTS

| | | |
|---|---|---|
| CN | 103491706 A | 1/2014 |
| EP | 0 257 737 A2 | 3/1988 |

(Continued)

OTHER PUBLICATIONS

Ramirez, A. G. et al., "Bonding nature of rare-earth-containing lead-free solders", Applied Physics Letter, vol. 80, No. 3, Jan. 21, 2002, pp. 1-3.

(Continued)

*Primary Examiner* — A. Dexter Tugbang
*Assistant Examiner* — Jeffrey T Carley
(74) *Attorney, Agent, or Firm* — Scully, Scott, Murphy & Presser, P.C.; Daniel P. Morris, Esq.

(57) ABSTRACT

A barrier layer is formed over electrically conductive contact pads on a substrate such as a wafer. A photoresist layer is applied over the barrier layer, and openings in the photoresist layer are filled with solder to form solder bumps. The barrier layer may be removed from within the openings prior to filling the openings with solder. The process is applicable to fine pitch architectures and chip size packaging substrates. The photoresist layer and portions of the barrier layer outside of the openings are removed following solder fill.

8 Claims, 4 Drawing Sheets

(51) Int. Cl.
*H05K 3/06* (2006.01)
*H05K 3/12* (2006.01)

(52) U.S. Cl.
CPC ............... *H05K 3/064* (2013.01); *H05K 3/12* (2013.01); *H01L 2224/11* (2013.01); *H05K 2203/04* (2013.01)

(56) References Cited

U.S. PATENT DOCUMENTS

| | | |
|---|---|---|
| 6,350,667 B1 | 2/2002 | Chen et al. |
| 6,362,531 B1 | 3/2002 | Stamper et al. |
| 7,328,830 B2 | 2/2008 | Bachman et al. |
| 8,125,618 B2 | 2/2012 | Lai et al. |
| 8,508,039 B1 | 8/2013 | Nasiri et al. |
| 2001/0020739 A1* | 9/2001 | Honda ............... H01L 21/4857 257/684 |
| 2002/0053746 A1 | 5/2002 | Stamper et al. |
| 2009/0014746 A1 | 1/2009 | Ramirez et al. |
| 2011/0136321 A1* | 6/2011 | Kuroda ............... H01L 21/6835 438/459 |
| 2012/0318855 A1 | 12/2012 | McLeod et al. |

FOREIGN PATENT DOCUMENTS

| | | |
|---|---|---|
| EP | 0 257 737 A3 | 3/1988 |
| JP | 2001-351861 A | 12/2001 |

OTHER PUBLICATIONS

Wang, L. et al., "Improvement of wettability and tensile property in Sn—Ag—RE lead-free solder alloy", Materials Letters 56 (2002), pp. 1039-1042.

Dudek, M.A. et al., "Novel Rare-Earth-Containing Lead-Free Solders with Enhanced Ductility", Journal of Materials, Jun. 2006, pp. 57-62.

Chen, W. et al., "Effect of Rare Earth Ce on the Microstructure, Physical Properties and Thermal Stability of a New Lead-Free Solder", Journal of mining and metallurgy, 47 (1) B, (2011) pp. 11-21.

Hung, F. et al., "Microstructures and Fusing Electrical Current of Microelectronic Sn—9Zn—(0.25RE) Solders", Materials Transactions, vol. 49, No. 7 (2008) pp. 1491-1495.

* cited by examiner

METHOD FOR FORMING SOLDER BUMPS USING SACRIFICIAL LAYER

BACKGROUND

The present application relates generally to semiconductor devices and methods for the manufacture thereof, and more specifically to solder bump formation for producing such devices, and to semiconductor devices that are provided with such solder bumps.

As the density of electronic devices increases, packaging of one microelectronic substrate to another has become increasingly difficult. As a result, high performance, robust and reliable interconnection systems and methods are desirable. Microelectronic substrates include, but are not limited to, integrated circuit chips, printed circuit boards, multi-chip module substrates, and other electronic packaging substrates that are used in microelectronic systems.

Solder bump technology, which is also referred to as C4 (controlled collapse circuit connection) or "flip chip" technology, is increasingly being used for microelectronic packaging. With solder bump technology, a bare integrated circuit can be mounted on a next level package without requiring encapsulation of the integrated circuit. Moreover, solder bump technology enables the utilization of the entire area of a microelectronic substrate for connection rather than only a peripheral portion thereof. High performance may be obtained because high frequency signal transmission may be obtained due to direct bonding.

In view of the foregoing, there is an ongoing need for smaller, less expensive, and more robust semiconductor package configurations and methods for their manufacture.

SUMMARY

The formation of a sacrificial metallic layer is incorporated into a method for forming solder bumps. An example method is an injection molded solder (IMS) process for forming solder bumps on the contact pads of package substrates. The process is applicable to fine pitch architectures and chip size packaging substrates. The metallic layer may function as a barrier layer and eliminate unwanted reactions between a dry film (photoresist) layer and a solder resist layer during solder deposition. Also, the metallic layer protects the solder resist layer and underlying substrate from chemical compositions used to strip the dry film. After removal of the dry film, the metallic layer can be selectively etched, thus avoiding damage to, and delamination of, the solder resist. In embodiments, portions of the metallic film can be alloyed with the as-deposited solder composition.

In accordance with embodiments of the present application, a method of making a circuit includes forming a metallic layer on a substrate having a plurality of electrically conductive contact pads, applying a photoresist layer on the metallic layer, forming a plurality of first openings in the photoresist layer above the contact pads exposing portions of the metallic layer, etching the exposed portions of the metallic layer, placing solder over the contact pads, removing the photoresist layer with a chemical composition, the substrate being protected from the chemical composition by the metallic layer, and etching the remaining metallic layer.

In accordance with further embodiments, a method of making a circuit includes forming a metallic layer on a substrate having a plurality of electrically conductive contact pads, applying a photoresist layer on the metallic layer, forming a plurality of first openings in the photoresist layer above the contact pads exposing portions of the metallic layer, placing solder over the exposed portions of the metallic layer, removing the photoresist layer with a chemical composition, the substrate being protected from the chemical composition by the metallic layer, and etching the metallic layer, wherein the exposed portions of the metallic layer at least partially diffuse into the solder.

A circuit such as an integrated circuit includes a substrate, a patterned photoresist layer and a barrier layer disposed on the substrate, and a solder bump disposed on the barrier layer, wherein the barrier layer thickness is from 10 nm to 1000 nm (1 micrometer). The barrier layer may react with the solder bump and adds to the solder bump composition, and is chemically resistant to chemical compositions used to remove the photoresist layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1A:
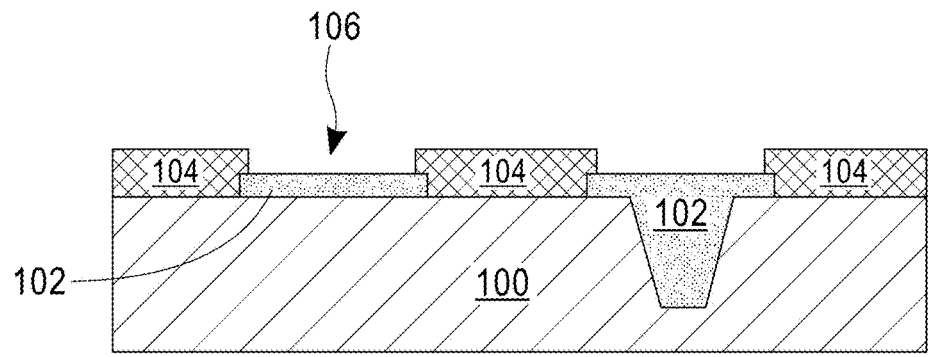
FIG. 1A is a schematic diagram illustrating a method according to one embodiment of forming solder bumps on an organic substrate having a plurality of exposed contact pads.

Reference will now be made in greater detail to various embodiments of the subject matter of the present application, some embodiments of which are illustrated in the accompanying drawings. The same reference numerals will be used throughout the drawings to refer to the same or similar parts. It is noted that the drawings are provided for illustrative purposes and, as such, may not be drawn to scale.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIGS. 1A-1G, a series of steps is disclosed in accordance with a first embodiment for producing solder bumps. Notably, FIG. 1 depicts a substrate 100 having a plurality of electrically conductive contact pads 102, a layer of solder resist 104 located on a portion of the substrate 100, and openings 106 in the solder resist 104 that expose electrically conductive pads 102. Such a structure can be obtained by depositing the layer of solder resist 104 followed by patterning and etching to expose the contact pads 102, or by applying a pre-manufactured contact pad assembly to the substrate 100. For instance, a layer of solder resist 104 can be applied to a substrate 100 such as a printed circuit board either by a screening method or by dispensing from a caulking cartridge using a pneumatic system.

In various embodiments, substrate 100 is an organic substrate. Non-limiting examples of organic substrates include laminate materials made of glass fibers in an epoxy, for example, FR-4 (flame retardant type 4) and BT-resin (bismaleimidetriazine resin).

Contact pads 102 comprise an electrical conductor such as a solder wettable electrical conductor. The contact pads 102 may be arranged in rows or arrays on the substrate 100, and may comprise a conductive metal such as copper, gold, palladium, or nickel.

The solder resist 104 is a polymeric material that prevents the solder from bridging between conductors. The solder resist 104 may comprise a material non-reactive with solder, for example, epoxy resin, acryl resin, or polyamide resin. The solder resist 104 may comprise a photopolymer.

Figure 1B:
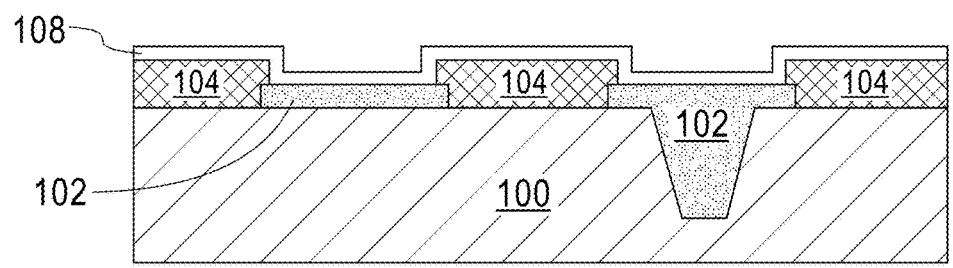
FIG. 1B shows the formation of a metallic layer over the contact pads of FIG. 1A.

As shown in FIG. 1B, a conformal metallic layer 108 is applied over the structure of FIG. 1A. In embodiments, the metallic layer 108 is formed directly over exposed portions of the contact pads 102 and the solder resist 104. The metallic layer 108, which may comprise Al, Ti, Cr, Fe, Ni, Cu, Pd, Au, a rare earth metal, and alloys thereof, has a thickness of 10 nm to 1 micron (e.g., 10, 20, 50, 100, 200, 500, or 1000 nm, including ranges between any of the foregoing).

Figure 1C:
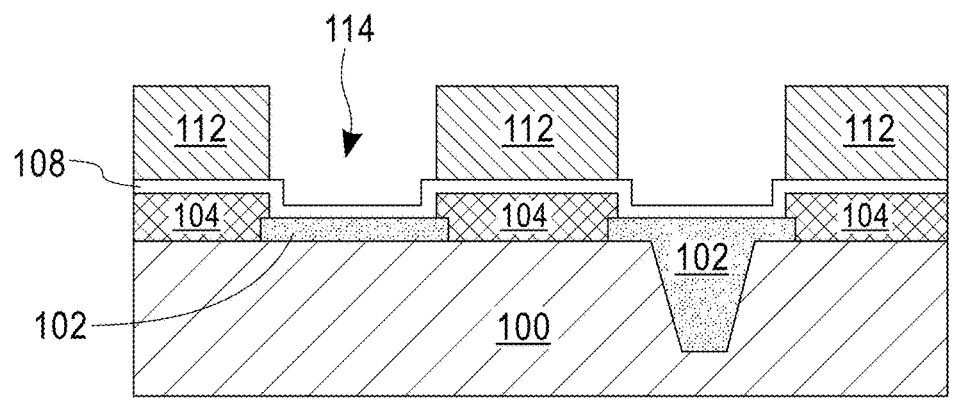
FIG. 1C shows a patterned photoresist layer disposed over the metallic layer.

As is shown in FIG. 1C, a dry film photoresist 112 is applied to the substrate above the metallic layer 108. The dry film 112 may comprise a photosensitive resin laminated body made from three layers, i.e., a carrier film, a photosensitive resin layer laminated on the carrier film, and a cover film that is disposed on the surface of the photosensitive resin layer (opposite to the carrier film).

The carrier film within the laminated body may comprise a polymer film such as, for example, a polyester film. By way of example, a polyester carrier film may be synthesized from polyethylene terephthalate.

By way of example, a photosensitive layer comprises: a) a multifunctional monomer whose photopolymerization is induced by light, b) a radical-inducing photo-initiator to bring about the photopolymerization, c) a binder polymer to provide mechanical strength, and adhesiveness of a photopolymerization composition, and d) additives such as dyes, stabilizers, adhesion promoters or thermal polymerization inhibitors. These materials, dissolved in an appropriate solvent, are coated on a polyester carrier film and then dried.

An example cover film is a polyolefin film. The carrier film provides mechanical support for the laminate, while the cover film serves as a damage resistance layer.

The dry film 112 may be heat resistant at solder reflow temperatures, e.g., at temperatures above 300° C., and may be applied using a pressurized hot roll. A dry film photoresist 112 having uniform thickness (e.g., 20 to 50 microns) can be used in conjunction with one or more embodiments as disclosed herein, though dry films 112 having thicknesses outside of the foregoing range may be used depending on the size of the solder bumps to be formed on the contact pads. Openings 114 are formed in the dry film 112 by patterning followed by etching or laser drilling after cure of dry film 112 (see FIG. 1C). Optionally, the dry film 112 may be cured by heat treatment in an oven after forming openings 114 in the dry film 112, but before molten solder injection.

While embodiment of the application are described in conjunction with a dry film of photoresist, it will be appreciated that chemical photoresists that are applied as a liquid (e.g., poly(methyl methacrylate), poly(methyl glutarimide), and phenol formaldehyde resins) may be used in conjunction with the disclosed methods.

Figure 1D:
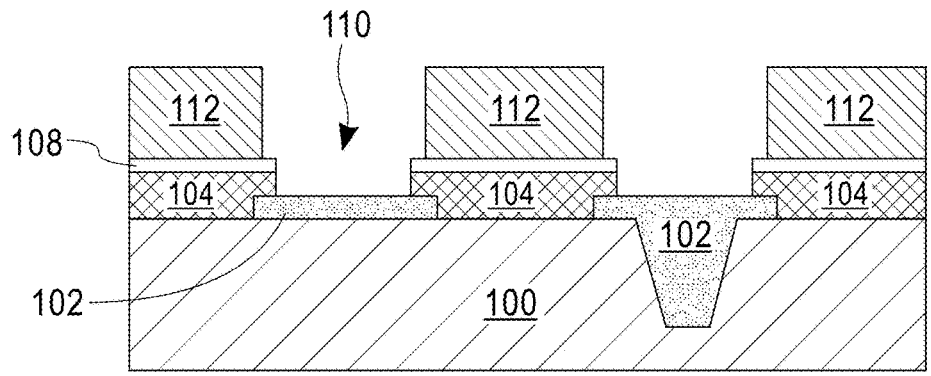
FIG. 1D shows etching of the metallic layer within openings defined by the photoresist layer.

Openings 110 are then formed in the metallic layer 108 by patterning followed by etching or laser drilling (see FIG. 1D). In embodiments, a dry film 112 with openings 114 may be used as a mask to form openings 110 in the metallic layer 108.

Openings 110, 114 may have the same or larger dimensions as the openings 106 in the solder resist and may be smaller than the dimensions of the contact pads 102. The opening size of the dry film 112 and the metallic layer 108 depends on the thickness of each layer, and the desired solder volume per pad.

Solder bumps may be formed or placed on the contact pads 102 in many ways, including evaporation, electroplating, printing, jetting, stud bumping, and direct placement. The results of these methods may differ in bump size and spacing ("pitch"), solder components and composition, cost, manufacturing time, equipment required, and assembly temperature.

The pioneering C4 process developed at IBM was based on evaporation of solder onto contact pads. Evaporated deposits are defined by a metal mask aligned with and mechanically clamped to the substrate at a controlled spacing.

High lead solder is commonly used to form bumps via evaporation. Low lead eutectic solder cannot readily be evaporated because of the difference in vapor pressures of lead and tin. Bump size and shape is determined by the mask openings and spacing. The evaporated solder is reflowed to form a spherical solder bump.

The evaporated bump allows good control of the alloy and uniform bump heights, though the process is limited to high lead solders with binary (two-component) alloys.

Electroplating of solder was developed as a less costly and more flexible method than evaporation. Bumping begins with photo-patterning and plating a minibump (typically copper) on the bump sites. This thick copper allows the use of high-tin eutectic solders without consuming the thin copper contact pad layer. A second photopatterning and plating of the solder alloy over the minibump forms the solder bump. The photoresist is then removed from the wafer and the bump is reflowed to form a sphere.

Electroplated bumping processes generally are less costly than evaporated bumping. Plating can allow a close bump spacing (35 to 50 microns) and may be used with high bump count (>3,000) chips because of its small feature size and precision.

Plating bath solutions and current densities must be controlled to avoid variations in alloy composition and bump height across the wafer. Plating generally is limited to binary alloys.

In a further approach, solder may be deposited by printing solder paste onto the contact pad by stencil or other means, and reflowing the solder paste to form a spherical solder bump. The printing process is less costly than evaporated processes, and comparable in cost to electroplating. Solder paste gives good control of the bump composition, and allows a variety of alloys to be used, including eutectic, lead-free, non-binary, and low alpha particle solders. However, printed solder bumps cannot achieve the close spacing of plated or injection molded bumps.

Less common methods of solder bumping include solder bump bonding with solder wire, solder jetting with molten solder, and solder ball placement directly onto the contact pad.

Solder bump bonding (SBB) uses solder wire in a modified wire bonder to place a ball of solder directly onto the contact pad. The scrubbing action of the wire bonder causes the solder ball to bond to the pad. The solder wire is broken off above the bump, leaving the bump on the pad, where it can be reflowed. Solder bump bonding is a serial process, producing bumps one by one at rates up to about 8 per second. Solder bump bonding has advantages in allowing closer spacing than printed bumps.

Solder jetting places solder bumps by controlling a stream of droplets of molten solder. Demand mode jetting systems use piezoelectrics or resistive heating to form droplets in much the same manner as an ink-jet printer. Mechanical positioning directs the droplet placement. Continuous mode jetting systems use a continuous stream of solder droplets with electrostatic deflection of the charged droplets to control placement.

Solder ball placement bumping depends on directly placing micro-spheres of solder on the contact pad, similar to methods well developed for ball-grid array (BGA) and chip scale packages (CSP).

Notwithstanding the foregoing methods, the present embodiment is described further below in conjunction with an injection molded solder (IMS) process for forming the solder bumps. With such an approach, a solder fill head moves translationally with respect to the substrate 100. Such movement may be provided by moving the fill head with respect to the substrate, by moving the substrate while maintaining the fill head in a stationary position, or both. Molten flux-free solder is injected into the openings 114 and preferably completely fills the openings 106, 110, 114 above the contact pads 102 so that the solder is level with the top surface of the dry film 112. Molten solder refers to a solder composition that has been liquified such as by the application of heat. Flux refers to a chemical cleaning agent, flowing agent or purifying agent such as a hydrocarbon compound or resin that may be incorporated into a solder composition. In embodiments, fluxes are omitted from the solder compositions used in conjunction with the IMS process disclosed herein. In embodiments, the solder is filled at least to a level higher than the thickness of the solder resist layer 104, allowing the formation of solder bumps 118 of desired height.

The IMS process and solder solidification may be conducted in a low oxygen environment, preferably less than 10,000 ppm oxygen, such as in a nitrogen environment. In some instances, a nitrogen or other inert environment during the IMS process enhances balling-up of the molten solder during solidification thereof. Thus, the presence of a nitrogen or other inert environment may be used to eliminate a subsequent reflow process.

Alternatively, a forming gas environment including nitrogen and hydrogen may be used (e.g., 90% $N_2$+10% $H_2$).

Figure 1E:
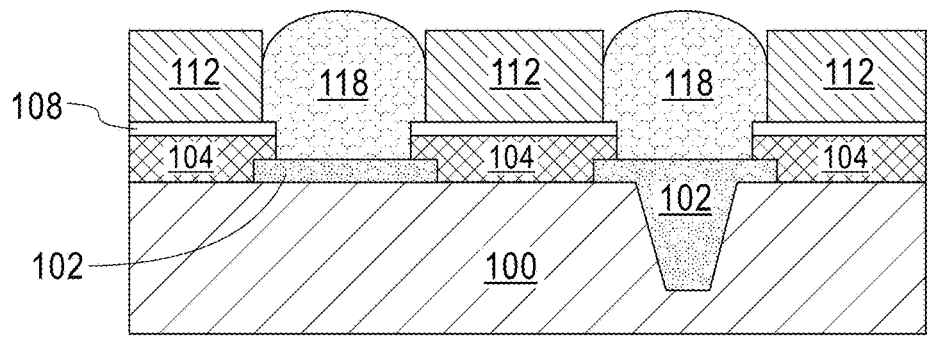
FIG. 1E shows the formation of solder bumps within openings defined by the photoresist layer and over the contact pads.

Solder bumps 118 following solidification are shown schematically in FIG. 1E. Solder bumps 118 have rounded top surfaces that extend above the top surface of the dry film 112. There is substantially no decrease of the solder volume during the process. Following solder solidification, the dry film 112 and metallic layer 108 are removed to produce the structure shown in FIG. 1G, where solder bumps 118 are disposed directly over contact pads 102. An optional reflow step may then be conducted such that solder structures become substantially hemispherical solder bumps.

Figure 1F:
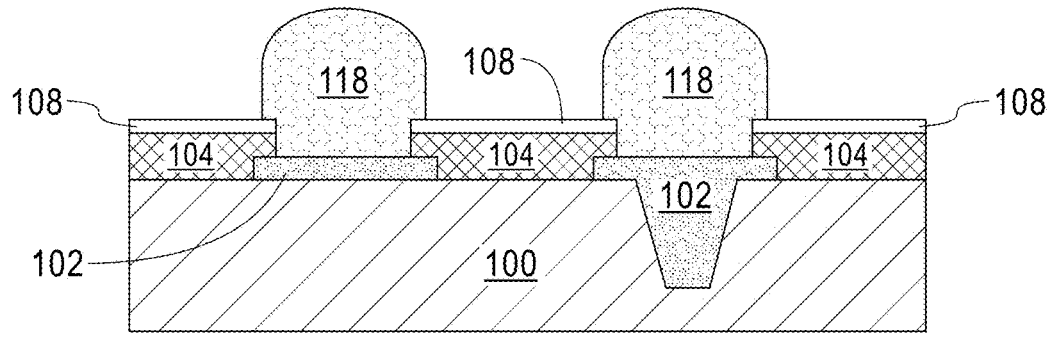
FIG. 1F shows stripping of the photoresist layer.
Figure 1G:
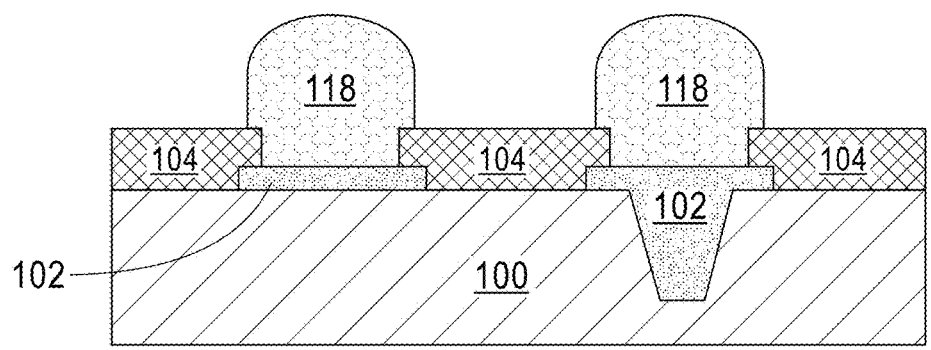
FIG. 1G shows solder bumps disposed over the contact pads after removal of the metallic layer.

As shown with reference to FIGS. 1E-1G, removal of the dry film 112 and the metallic layer 108 may be performed in successive steps. In embodiments, the metallic layer 108 protects the solder resist layer 104 and underlying substrate 100 from chemical compositions used to strip the dry film 112. As such, with the metallic layer 108 disposed over the solder resist layer and under the dry film 112, removal of the dry film 112 can be carried out without negatively affecting organic layers or structures under the metallic layer. A chemical composition such as dimethylsulfoxide (DMSO) can be used to remove the dry film 112.

After removal of the dry film 112, an acid etch can be used to remove the exposed metallic layer 108. The acid etch is selective to the metallic layer 108 and beneficially does not react with or damage the solder mask or solder bumps. An example acid etch comprises phosphoric acid.

Metallic layer 108 is a sacrificial layer disposed between the dry film 112 and the solder mask 104 that facilitates removing the dry film 112 without damaging the solder mask 104. After removal of the dry film 112, the metallic layer 108 can be removed using a process that is not damaging to the solder mask 104.

In connection with the instant embodiment, in addition to openings 114 formed in dry film 112, openings 110 are formed in the metallic layer 108 prior to forming the solder bumps 118. Thus, the metallic layer 108 is removed from over the contact pads 102 prior to deposition of the solder such that the deposited solder is disposed directly on the contact pads 102.

Figure 2A:
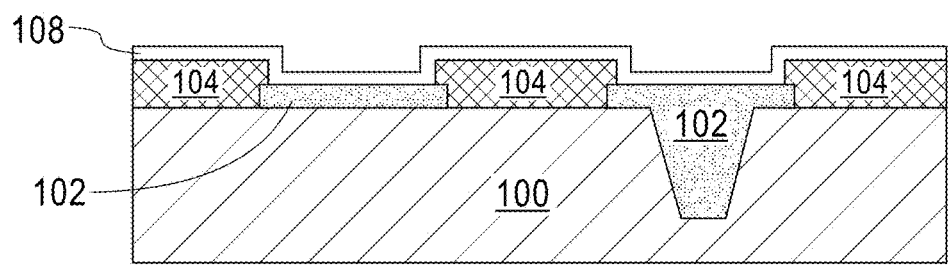
FIG. 2A is a schematic diagram illustrating a method of forming solder bumps according to a further embodiment where a metallic layer is disposed over contact pads formed on an organic substrate.
Figure 2B:
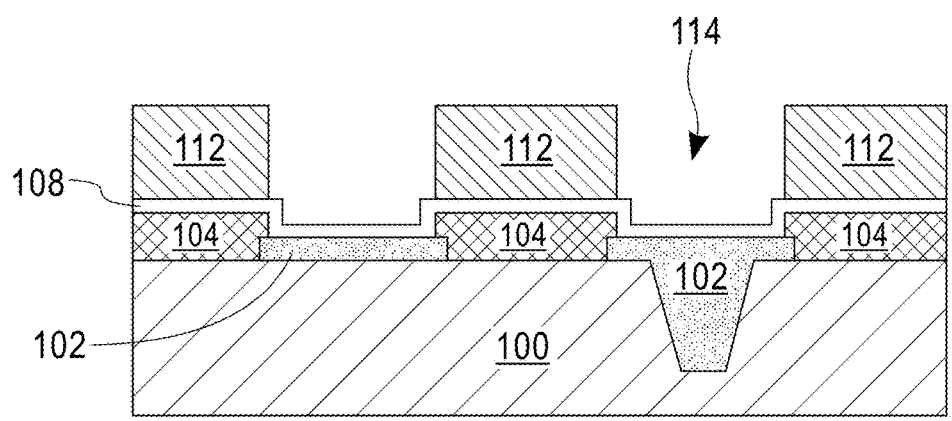
FIG. 2B shows a patterned photoresist layer disposed over the metallic layer.
Figure 2C:
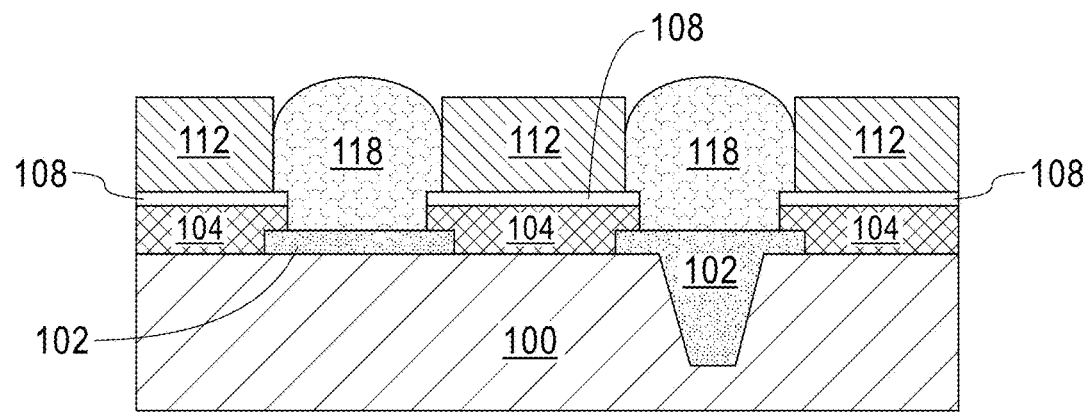
FIG. 2C shows the formation of solder bumps within openings defined by the photoresist layer and over the metallic layer whereby the solder is alloyed with the metallic layer.

Referring now to FIGS. 2A-2D, there are illustrated a series of steps in accordance with a second embodiment for producing solder bumps. Shown in FIG. 2A is a substrate 100 having a plurality of electrically conductive contact pads 102 and a layer of solder resist 104 with openings in the solder resist 104. Such a structure can be obtained by depositing the layer of solder resist 104 followed by patterning and etching to expose the contact pads 102, or by applying a pre-manufactured contact pad assembly to the substrate 100.

Still with reference to FIG. 2A, a conformal metallic layer 108 is applied over exposed portions of the contact pads 102 and the solder resist 104, and a dry film photoresist 112 is applied to the substrate 100 above the metallic layer 108. As in the previous embodiment, openings 114 are formed in the dry film 112 by patterning followed by etching or laser drilling. Openings 114 may have the same or larger dimensions as the openings in the solder resist 104 and may be smaller than the dimensions of the contact pads 102.

While the instant embodiment is explained further below with respect to an injection molded solder (IMS) process for forming the solder bumps, it will be appreciated that the solder bumps may be formed or placed on the contact pads 102 in many ways, including evaporation, electroplating, printing, jetting, stud bumping, and direct placement.

A solder fill head (not shown) moves translationally with respect to the substrate 100 and molten flux-free solder is injected into the openings 114 and preferably completely fills the openings 106, 114 above the contact pads 102 so that the solder is level with the top surface of the dry film 112. In embodiments, the solder is filled at least to a level higher than the thickness of the solder resist layer 104, allowing the formation of solder bumps 118 of desired height.

In the illustrated embodiment, openings are not formed in the metallic layer 108 prior to forming the solder bumps. Thus, the deposited solder is disposed directly on the metallic layer 108. During the IMS process and subsequent solder solidification, which may be conducted in a low oxygen environment, and/or during the reflow process (if used), the portion of the metallic layer 108 within opening 114 diffuses into the overlying solder. The composition of the associated solder bump is thus an amalgamation (alloy) comprising both deposited solder and material from the metallic layer 108.

Diffusion of the metallic layer material into the solder may be sufficiently facile that the metallic layer material is homogeneously dispersed throughout the solder bump. Alternatively, the metallic layer material may be non-homogeneously dispersed throughout the solder bump. In embodiments, all or substantially all of the metallic layer 108 disposed over the contact pads 102 is incorporated into a solder bump.

Figure 2D:
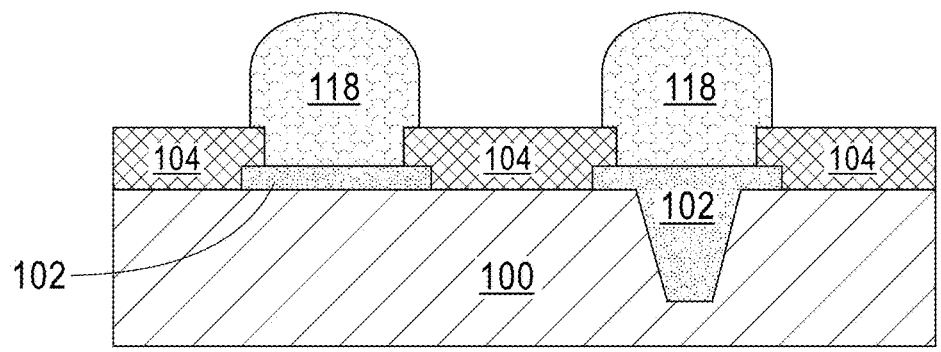
FIG. 2D shows alloyed solder bumps disposed over the contact pads after removal of the photoresist layer.

As shown with reference to FIGS. 2E and 2D, the dry film 112 and remaining metallic layer 108 may be removed in successive steps. As in the previous embodiment, the metallic layer 108 protects the solder resist layer 104 and underlying substrate 100 from the chemical composition(s) used to strip the dry film 112. A chemical composition such as dimethylsulfoxide (DMSO) can be used to remove the dry film 112. After removal of the dry film 112, an acid etch such as a phosphoric acid etch can be used to remove the remaining metallic layer 108. As shown in FIG. 2D, the resultant structure includes alloyed solder bumps disposed directly over contact pads 102.

In each of the foregoing embodiments, the metallic layers are not retained in the final device.

Metallic layer materials particularly suitable for in situ alloying of the solder bumps include rare earth metals including, but not limited to, scandium, yttrium, lanthanum, cerium, praseodymium, promethium, neodymium, samarium, europium, gadolinium, terbium, dysprosium, holmium, erbium, thulium, ytterbium, and lutetium.

Multiple solder compositions may be used in conjunction with the disclosed methods. For instance, solder bumps can be made from pure tin (Sn) as well as binary, tertiary, and quaternary tin-based alloys. Suitable tin alloys may include copper (Cu), zinc (Zn), silver (Ag), gold (Au) and/or bismuth (Bi), e.g., Sn:Cu, Sn:Zn, Sn:Ag, Sn:Au, Sn:Bi, Sn:Ag:Cu, and Sn—Ag—Cu—Bi. Such compositions may comprise eutectic compositions. As defined herein, for a composition of specified constituents, a eutectic composition exhibits the minimum solidification temperature. By way of example, Sn:Ag:Cu solders have a eutectic composition at 3.5 wt. % Ag, 0.9 wt. % Cu (balance Sn) and a corresponding eutectic temperature of 217° C.

Example solder compositions are lead-free. Lead-free solder alloys may be modified by doping a minor amount of alloying elements (such as Fe, Co, Ni, Zn, In, Bi, rare earths, and others). Without wishing to be bound by theory, it is believed that minor alloying elements such as Zn, Ni and Co are effective in reducing the amount of undercooling in Sn-rich solders. Example Pb-free solder compositions may include 85 to 99.9 wt. % tin. A solder bump formed from a silver-tin alloy, for example, may comprise 2.5 wt. % to 4.5 wt. % silver and 97.5 wt. % to 95.5 wt. % tin, e.g., 3.5 wt. % silver and 96.5 wt. % tin.

Solder bumps that include a rare earth metal may comprise up to 3 wt. % rare earth metal (e.g., 0.05, 0.1, 0.2, 0.5, 1, 2 or 3 wt. % rare earth metal, including ranges between any of the foregoing values). Summarized in Table 1 are example solder bump compositions, including the composition of the solder as-deposited (e.g., via IMS) and the composition of the solder bump following in-situ alloying with a rare earth metallic layer.

TABLE 1

Example solder compositions - as-deposited and following in situ alloying with a sacrificial metallic layer

| Initial solder composition | Rare earth metallic layer | Solder bump composition(s) |
|---|---|---|
| Sn:Ag | Lu | 0.5-2 wt. % Lu |
| Sn:Ag | La + Ce | 0.25-1 wt. % (La + Ce) |
| Sn:Zn | La + Ce | 0.25-1 wt. % (La + Ce) |
| Sn:Au | Lu | 0.5-2 wt. % Lu |
| Sn:Ag:Cu | La | 0.5-2 wt. % La |
| Sn:Ag:Cu | Ce | 0.05-2 wt. % Ce |
| Sn:Ag:Cu | Yb | 0.5-2 wt. % Yb |
| Sn:Ag:Cu | Nd | 0.5-2 wt. % Nd |
| Sn:Ag:Cu:Bi | Ce | 0.05-1 wt. % Ce |

As disclosed herein, incorporation of a sacrificial metallic layer into a process for forming solder bumps eliminates undesired reactions between the dry film photoresist and the solder resist, and allows efficient and benign removal of each of the photoresist layer and the metallic barrier layer.

The disclosed methods are applicable to high- and low-volume solder bump formation in fine pitch architectures and chip size packaging substrates, and are economical compared to conventional methods such as those using electroformed metal masks for solder paste printing. In embodiments, the solder bump height can range from 20 microns to 70 microns. For example, 70 micron high solder bumps (above the solder resist) can be formed on 150 micron pitch substrates (4,500 areal arrays in an area of 11×15 mm) and 35 micron high solder bumps can be formed on 80 micron pitch substrates (15,000 bumps in an area of 10×10 mm).

The methods described above can be used in the fabrication and packaging of integrated circuit chips. In particular, techniques set forth herein can be used to make arrays of solder bumps for attachment to an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon such as the resist layers) to be patterned or etched or otherwise processed.

The resulting integrated circuit chips can be distributed as a single wafer that has multiple unpackaged chips, as a bare die, or in packaged form. In a packaged form, the chip may be mounted in a single chip package or in a multichip package. In various embodiments, the chip is then integrated with other chips, discrete circuit elements, and/or other signal processing devices as part of either an intermediate product, such as a motherboard, or an end product.

As used herein, the singular forms "a," "an" and "the" include plural referents unless the context clearly dictates otherwise. Thus, for example, reference to a "rare earth metal" includes examples having two or more such "rare earth metals" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

As used herein, an element such as a layer or region that is "on" or "over" or "disposed over" a substrate or other layer refers to formation above, or in contact with, a surface of the substrate or layer. For example, where it is noted or recited that a layer is disposed over a substrate or other layer, it is contemplated that intervening structural layers may optionally be present between the layer and the substrate. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a metallic layer that comprises a rare earth metal include embodiments where a metallic layer consists essentially of a rare earth metal and embodiments where a metallic layer consists of a rare earth metal.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A method of making a circuit, comprising:
   providing a plurality of spaced apart conductive contact pads on a substrate, wherein each conductive contact pad is separated by a solder resist and each solder resist and each conductive pad is in direct physical contact with a surface of the substrate;
   forming a metallic layer on physically exposed surfaces of each conductive contact pad and each solder resist;
   applying a photoresist layer on the metallic layer;
   forming a plurality of first openings in the photoresist layer exposing portions of the metallic layer;
   etching the exposed portions of the metallic layer to physically expose a topmost surface of each conductive contact pad, while maintaining portions of the metallic layer on the solder resist that is located beneath remaining portions of the photoresist layer;
   placing solder directly on the physically exposed topmost surface of each conductive contact pad;
   removing, after the placing of the solder, the remaining portions of the photoresist layer with a chemical composition to expose the remaining portions of the metallic layer, the substrate being protected from the chemical composition by the remaining portions of the metallic layer; and
   removing the remaining portions of the metallic layer to physically expose the solder resist that is in direct physical contact with the surface of the substrate.

2. The method of claim 1, wherein the substrate is an organic substrate.

3. The method of claim 1, wherein the photoresist layer comprises a dry film layer.

4. The method of claim 1, wherein the metallic layer thickness is from 10 nm to 1000 nm.

5. The method of claim 1, wherein the metallic layer comprises a metal selected from the group consisting of Al, Ti, Cr, Cu, Pd, Au, and alloys thereof.

6. The method of claim 1, wherein the placing solder comprises passing a filling head containing molten solder over the photoresist layer and causing the filling head to inject molten solder to fill the first openings.

7. The method of claim 1, wherein placing the solder comprises injecting flux-free molten solder into the first openings.

8. The method of claim 1, wherein the chemical composition comprises dimethylsulfoxide.

* * * * *